United States Patent [19]

Utsumi

[11] Patent Number: 4,725,479
[45] Date of Patent: Feb. 16, 1988

[54] POLYETHYLENE NAPHTHALATE FILM FOR MEMBRANE SWITCH

[75] Inventor: Shigeo Utsumi, Yokohama, Japan

[73] Assignee: Diafoil Company, Limited, Tokyo, Japan

[21] Appl. No.: 938,956

[22] Filed: Dec. 8, 1986

[30] Foreign Application Priority Data

Dec. 10, 1985 [JP] Japan .................. 60-277752

[51] Int. Cl.$^4$ .............................................. B32B 3/00
[52] U.S. Cl. ..................... 428/209; 428/215; 428/461; 428/901
[58] Field of Search .............. 428/901, 131, 209, 215, 428/461; 200/5 A; 427/76

[56] References Cited

U.S. PATENT DOCUMENTS

| | | | |
|---|---|---|---|
| 4,026,703 | 5/1977 | Hayashi et al. | 96/1.5 |
| 4,143,253 | 3/1979 | Wagner et al. | 200/5 A |
| 4,166,876 | 9/1979 | Chiba et al. | 428/215 |
| 4,198,458 | 4/1980 | Mitsuishi et al. | 428/212 |
| 4,258,096 | 3/1981 | La Marche | 428/209 |
| 4,314,114 | 2/1982 | Larson | 200/5 A |
| 4,324,962 | 4/1982 | Dulen | 200/159 B |
| 4,386,130 | 5/1983 | Hayashi et al. | 428/215 |
| 4,434,209 | 2/1984 | Sasaki et al. | 428/416 |
| 4,559,426 | 12/1985 | Van Zeeland et al. | 200/159 B |
| 4,562,315 | 12/1985 | Aufderheide | 200/5 A |
| 4,619,869 | 10/1986 | Kiriyama et al. | 428/480 |
| 4,623,768 | 11/1986 | Grant | 200/159 B |

Primary Examiner—John E. Kittle
Assistant Examiner—Patrick J. Ryan
Attorney, Agent, or Firm—Oblon, Fisher, Spivak, McClelland & Maier

[57] ABSTRACT

Disclosed herein is a biaxially oriented polyethylene naphthalate film which shows the haze-increasing rate, represented by the formula:

Haze-increasing rate (%) = $[(H_2 - H_1)/H_1] \times 100$ wherein $H_1$ is the haze before subjecting the film to heat treatment and $H_2$ is the haze after subjecting the film to heat treatment, of not more than 20% and both the heat shrinkage in the longitudinal direction and the heat shrinkage in the transversal direction of not more than 0.5% when subjecting the film to heat treatment for 2 hours at 150° C.

7 Claims, No Drawings

POLYETHYLENE NAPHTHALATE FILM FOR MEMBRANE SWITCH

BACKGROUND OF THE INVENTION

The present invention relates to a polyester film for membrane switch, and in detail, the present invention relates to a polyethylene naphthalate film for membrane switch, which is excellent in the transparency and dimensional stability at processing.

Furthermore in detail, the present invention relates to a biaxially oriented polyethylene naphthalate film for membrane switch, which shows the haze-increasing rate represented by the formula:

$$\text{Haze-increasing rate (\%)} = \frac{H_1 - H_2}{H_1} \times 100$$

wherein $H_1$ is the haze before subjecting the film to heat treatment and $H_2$ is the haze after subjecting the film to heat treatment, of not more than 20% and both the heat-shrinkage in the longitudinal direction and the heat shrinkage in the transversal direction of not more than 0.5 % at subjecting the film to heat treatment for 2 hours at 150° C.

Accompanying with the modernization of the electrical and electronic parts, the switches are shifting from the conventional push-type, slide-type or rotary-type to the thin membrane switch such as membrane switch, touch panel, transparent touch panel, etc., using a plastic film and particularly, in the card-type electronic calculator, the membrane switches have been used widely.

As the method for producing the membrane switch, (i) a method in which a circuit is printed on the surface of a polyethylene terephthalate film (hereinafter referred to as PET film) with an electroconductive paint, the spacer part is painted with an electroinsulating paint thereon and the thus painted films are piled and stuck together while facing the painted surfaces to each other, or (ii) a method in which a circuit is printed on the surface of PET film with an electroconductive paint, and the thus painted PET films are stuck together while facing the painted surfaces to each other and interposing an insulating material as the spacer between the two PET films, has hitherto been carried out.

As an electroconductive material for circuit of the membrane switch using the PET films, a silver series electroconductive material and a carbon series electroconductive material covering it are generally used.

In order to form an electroconductive circuit on the surface of the PET film, at first the silver paste is screen-printed on the PET film, and after drying and solidifying the paste, a carbon paste is further painted so as to cover the part printed by the silver paint. Namely, a method by which the screen-printing is carried out more than two times has been adopted.

Hereupon, although it is necessary for drying the painted paste after printing to subject it to heat treatment for from a few minute to one hour at a temperature in the range of from 130° to 180° C., under such drying condition, the PET film shrinks by heating and as a result of the dimensional change of PET film the film flatness of the PET film is spoiled, thereby making difficult to carry out the printing in less than a second with favorable accuracy. For instance, a dimensional difference is formed between the silver paste printing and the printed pattern of the carbon paste printed after drying the silver paste, thereby it becomes impossible to carry out the accurate printing. In such a situation, there occurs problems that the prevention of the migration due to the carbon paste and the decrease of the resistance value become insufficient.

Further, there occurs a problem that it becomes difficult to stick the spacer parts (printed surfaces) of the PET films together while facing the electroconductive circuit parts to each other.

Hitherto, in order to solve these problem, the PET film is subjected to heatset treatment as a sheet under the severer conditions than the drying conditions after printing, thereby preliminarily shrinking the film to restrict the dimensional change of the PET film during the drying step to the minimum.

However, in the case of carrying out the heatset treatment, the oligomer of polyethylene terephthalate educes on the PET film and sticks thereto, thereby significantly spoiling the appearance of the film, increasing the turbidity (film haze) of the film and decreasing the transparency of the film. In the case of using the film of which the transparency has been spoiled, for the membrane switch, the appearance of the switch is significantly damaged. Further, in the case of using the thus spoiled film as a base film of the membrane switch of the electronic calculator provided with a solar cell, etc., since a part of the film must remain in a transparent state in order to use such a transparent part as a protecting film for the solar cell, the capacity of the solar cell in the case where the film has haze is severely reduced.

Accordingly, in the membrane switch, it is extremely important to retain the transparency of the film and for such a purpose, it is necessary to prevent the eduction and sticking of the oligomer on the surface of the PET film. For the purpose, each of the sheet-form PET is wiped to remove the educed and sticking oligomer.

Furthermore, since the printing is carried out after subjecting the PET sheet to heatset treatment, a high processing cost needs and accordingly, a continuous printing has been also demanded.

As a result of the present inventor's studies in consideration of the above-mentioned circumstances, it has been found by the present inventor that the problems can be solved by using, instead of polyethylene terephthalate film, polyethylene naphthalate film showing a heat-shrinkage of less than the specified value and a haze-increasing rate before and after thermal treatment of less than the specified value, and on the basis of the finding, the present inventor has attained the present invention.

SUMMARY OF THE INVENTION

In a first aspect of the present invention, there is provided a biaxially oriented polyethylene naphthalate film for a membrane switch, which shows the haze-increasing rate, represented by the formula:

$$\text{Haze-increasing rate (\%)} = \frac{H_2 - H_1}{H_1} \times 100$$

wherein $H_1$ is the haze before subjecting the film to heat treatment and $H_2$ is the haze after subjecting the film to heat treatment of not more than 20% and both the heat-shrinkage in the longitudinal direction and the heat-shrinkage in the transversal direction of not more than 0.5% at subjecting the film to heat treatment for 2 hours at 150° C.

In a second aspect of the present invention, there is provided, a membrane switch wherein a printed board comprises a biaxially oriented polyethylene naphthalate film which shows the haze-increasing rate of not more than 20% and the heat shrinkage both in the longitudinal direction and in the transverse direction of not more than 0.5% at subjecting to heat treatment for 2 hours at 150° C., and has been printed with an electroconductive material for circuit on one of the surfaces of the film.

DETAILED DESCRIPTION OF THE INVENTION

The polyethylene naphthalate used in the present invention represents the polymers constructed substantially of ethylene 2,6-naphthalate as the constitutional unit, and also ethylene 2,6-naphthalate modified with a small amount of e.g. less than 10 mol%, preferably less than 5 mol% of a third component.

Polyethylene naphthalate is generally produced by polycondensing naphthalene-2,6-dicarboxylic acid or a functional derivative thereof, for instance, dimethyl naphthalene-2,6-dicarboxylate and ethylene glycol in the presence of a catalyst under a suitable reaction conditions. As the third component, dicarboxylic acids such as adipic acid, sebacic acid, phthalic acid, isophthalic acid, terephthalic acid, naphthalene-2,7-dicarboxylic acid, etc., and the lower alkyl esters thereof; oxycarboxylic acids such as p-oxybenzoic acid and the lower alkyl esters thereof; and dihydric alcohols such as propylene glycol, trimethylene glycol, tetramethylene glycol, pentamethylene glycol, hexamethylene glycol, etc. may be exemplified.

As the polyethylene naphthalate used in the present invention, a polymer showing an adequate polymerization degree indicated by an intrinsic viscosity of not less than 0.40, preferably from 0.45 to 0.90, and more preferably from 0.55 to 0.85 is preferable, because the polyethylene naphthalate is poor in mechanical properties in the case where the polymerization degree is too low. (The method for measuring the intrinsic viscosity: 1 g of a polyethylene naphthalate tip or film is added to 100 ml of a mixture of phenol and 1,1,2,2-tetrachloroethane (50:50 by weight) and the mixture is heated for 30 min at 140° C., thereby dissolving the specimen of the polyethylene naphthalate, and thereafter, the intrinsic viscosity of the solution is measured at 30.0° C.).

The haze-increasing rate of the film of the present invention after subjecting the film to heat treatment for 2 hours at 150° C., represented by the following formula:

$$\text{Haze-increasing rate (\%)} = \frac{H_2 - H_1}{H_1} \times 100$$

wherein $H_1$ is the haze before subjecting the film to heat treatment and $H_2$ is the haze after subjecting the film to heat treatment is not more than 20%, preferably not more than 10% and more preferably not more than 5%. In the case of the haze-increasing rate of more than 20%, it is undesirable because of the eduction (bleeding) of the low molecular polymer (oligomer) on the surface of the film. The eduction of the oligomer not only deteriorates the transparency of the film but also spoils the printed surface during the printing step and/or the painting step of the electroconductive layer on the film and deteriorates the adhesion of printing.

Further, the heat-shrinkage of the film of the present invention both in the longitudinal direction and in the transversal direction after being subjected to heat treatment for 2 hours at 150° C. is not more than 0.5%, preferably not more than 0.3%. In the case of the heat shrinkage of more than 0.5%, when, after printing the silver paint, the carbon paint is printed with the same pattern as that of the silver paint on the thus printed pattern, the carbon paint pattern gets out of position from the silver paint pattern, thereby failing the role of the switch, and in addition, the film shrinks by the heat during the printing processing, thereby the film flatness is deteriorated.

On the other hand, in the case of using the film substantially not containing any particles while setting importance on the transparency of the film, in order to improve the processability of the film of the present invention, it is necessary to carry out emboss-processing. Also, it is preferable to improve the blocking property by making the film contain the particles. In such a case, a method of combining fine particles of an inert compound in the polyethylene naphthalate for use in producing the membrane is preferably adopted.

As one of the above-mentioned methods, there is a method wherein fine particles are separated by reacting a phosphorous compound to a metal compound which has dissolved in the reaction system of the production of the polyethylene naphthalate, for instance a metal compound dissolved in the reaction system after the esterinterchange reaction, the method being so-called "particle deposited method". Although the particle deposited method is simple and can be easily adopted industrially, since the resistivity of the polymer in the molten state is changed, it is considerably difficult to have suitable resistivity and the suitable surface roughness of the film coexist, and there is a limit in the amount of the deposited particles.

As another method which is preferably used, there is a "particle addition method" in which inert fine particles are combined with the polyester in any step of from the producing step of the polyester to the extruding step before producing the membrane. As the inert fine particles, at least one kind of metal compound selected from the group consisting of kaolin, talc, magnesium carbonate, calcium carbonate, barium carbonate, calcium sulfate, barium sulfate, lithium phosphate, calcium phosphate, magnesium phosphate, aluminum oxide, silicon oxide, titanium oxide, etc. may be exemplified, however, they are not limited thereto.

The shape and form of the fine particles of the inert metal compound may be spherical, massive or flaky, and concerning the hardness, specific gravity, colour, etc., there is not particularly any limitation. The average particle diameter of the particles of the inert metal compound is the range of from 0.1 to 10 μm, preferably from 0.3 to 3 μm.

Further, the amount of the inert compound to be added to the film is the range of from 0.01 to 1% by weight, preferably from 0.05 to 0.8% by weight and more preferably from 0.1 to 0.5% by weight.

The thickness of the polyethylene naphthalate film of the present invention is not particularly limited, however, in the case of adapting to the membrane switch, the film of from 12 to 250 μm in thickness is preferred.

The method of producing the film of the present invention will be explained as follows, however, the method is not to limited to the following method as far as satisfying the necessary properties of the film.

After drying the raw material (pellets) of polyethylene-2,6-naphthalate containing fine particles of kaoline, silica, etc., the thus dried pellets are melt-extruded at a temperature in the range of from 280° to 320° C. into a sheet-form, and the thus extruded sheet is cooled to a temperature of lower than 80° C. to obtain a substantially amorphous sheet.

In the case of cooling, it is preferable to adopt an ordinary electrostatic cooling method. Then, the thus obtained amorphous sheet is stretched in the longitudinal direction and in the transverse direction at draw ratio of at least 4 times in surface ratio and at a temperature of from 120° to 170° C. to obtain a biaxially oriented film, and the thus obtained film is subjected to heatset treatment at a temperature of from 120° to 250° C. It is preferable in the heatset treatment step that the thus treated film is subjected to relaxation treatment both in the longitudinal direction and in the transversal direction in the extent of from 0.2 to 20% at a temperature of 120° to 250° C. in the maximum temperature zone of heatset treatment apparatus and/or the cooling zone of the outlet vicinity of heatset treatment apparatus. The thus obtained film is subjected to re-heatset treatment at a temperature of from 130° to 200° C. under a low tension.

The thus produced polyethylene naphthalate film of the present invention can be processed into a membrane switch which can be continuously printed and is excellent in the transparency, the printability and the film flatness after printing by carrying out an electroconductive screen printing thereon.

For instance, as the membrane switch, those of metal disk type, membrane switch type, membrane type with a click, etc. may be exemplified. Namely, (1) the membrane switch of metal disk type comprises a printed board of a biaxially oriented polyethylene naphthalate film (hereinafter referred to as a PEN film) on one of the surfaces of which an electroconductive material for the circuit has been printed, the printed board being superposed on a surface sheet via an insulating spacer disposed at the non-printed part of the printed board, and a metal disk contact point disposed in the electroconductive printed part. (2) The membrane switch of membrane type comprises two printed boards of a biaxially oriented PEN film on one of the surfaces of which an electroconductive material for the circuit has been printed, the printed surfaces thereof facing each other and the printed boards being superposed via an insulating spacer disposed at the non-printed part thereof, and a surface sheet laminated on the non-printed surface of one of the PEN films. (3) The membrane switch of membrane type with a click is comprising two printed boards of a biaxially oriented PEN film on one of the surfaces of which an electroconductive material for the circuit has been printed, the printed surfaces thereof facing to each other and the printed boards being superposed via an insulating spacer disposed at the non-printed part thereof, a surface sheet laminated on the thus superposed PEN films via an insulating spacer, and a metal disk for the click, disposed in the space comprising the superposed PEN film, the surface sheet and the insulating spacer, and corresponding to the printed contact point of the electroconductive material. As a surface sheet, a biaxially oriented polyethylene terephthalate film may be exemplified.

The membrane switch of the above-mentioned construction can be used as a key board of the office machines such as personal computer, duplicating machine, facsimile, electronic calculator, etc., television, video, electronic oven, washing machine, etc.

Since the PEN film of the present invention shows a small heat shrinkage both in the longitudinal direction and in the transverse direction, it is not necessary to wipe out the bled material (oligomer) of low molecular weights in the case of forming an electroconductive part on the film by screen printing in the process of producing the membrane switch, and since there is no trouble of printing aberration due to the shrinkage of the film, it is possible to produce continuously the membrane switch of a high performance and of a high commercial value with a low cost.

Furthermore, since the PEN film of the present invention is excellent in weather-resistance and can be used also as a protecting film for solar cells, the PEN film of the present invention is extremely useful as the thin membrane switch of a machine provided with solar cell(s).

The present invention will be explained more in detail while referring to the following non-limitative Examples and Comparative Examples.

In addition, the "part" in the following Examples and Comparative Examples means the "part by weight".

The properties of the films were determined by the following methods.

(1) Haze-increasing rate:

The film haze is measured following the method of Japanese Industrial Standards (JIS) K-6714 before and after subjecting the film to heatset treatment, and the haze-increasing rate is represented by the percentage of the difference between the haze value ($H_2$) after heatset treatment and that ($H_1$) before heatset treatment to the haze value before heatset treatment.

$$\text{Haze-increasing rate (\%)} = \frac{H_2 - H_1}{H_1} \times 100$$

(2) Heat-shrinkage:

Heat-shrinkage is represented by the percentage of the difference between the dimension ($L_1$) of the test piece before heating and that ($L_2$) after heating to the dimension before heating.

$$\text{Heat-shrinkage (\%)} = \frac{L_1 - L_2}{L_1} \times 100$$

(3) Film flatness:

After extending a film subjected to heat treatment for 2 hours at 150° C. on a flat plate, the appearance of the specimen is observed by naked eyes.

(4) Evaluation of the aberration of the printed pattern on the PEN film:

After screen-printing a silver paste on the PEN film without being subjected to heatset treatment, the thus painted paste is dried to be solidified, and thereafter a carbon paste is screen-printed so as to cover the printed part by the silver paint, thereby forming an electroconductive circuit, and the two electroconductive circuit parts (printed surfaces) are superposed together so as to face each other via an insulating spacer, thereby forming a membrane switch, and the aberration of the thus superposed two circuits is evaluated by naked eyes.

Good: the two circuits have completely coincided.

Bad: any abberation is found between the two circuits.

EXAMPLE 1

1-1: Production of polyethylene naphthalate:

In a reaction vessel, 100 parts of dimethyl naphthalene-2,6-dicarboxylate, 60 parts of ethylene glycol and 0.1 part of hydrous calcium acetate were introduced, and ester interchange reaction was started at 180° C. With the distillation of methanol, the reaction temperature was raised slowly to 230° C. within 4 hours to complete the ester interchange reaction substantially.

In the next place, after adding 0.04 part of phosphoric acid to the reaction mixture, 0.05 part of silica of an average particle diameter of 1.4 μ and 0.04 part of antimony trioxide were added to the reaction mixture to carry out polycondensation following the ordinary method. Namely, the reaction temperature was slowly raised to 290° C. and the pressure was slowly reduced from the ordinary pressure to 0.3 mmHg after 2 hours.

The reaction was stopped after 4 hours from the start of the reaction, and the thus formed polyethylene naphthalate was blown out from the reaction vessel under a pressure of nitrogen gas. The intrinsic viscosity of the thus obtained polyethylene naphthalate 0.63.

1-2: Production of a polyethylene naphthalate film:

An amorphous sheet-form of polyethylene naphthalate was produced by extruding the thus obtained polyethylene naphthalate at 295° C. from an extruder while using the electrostatic cooling method. Namely, while using a tungsten wire of 0.1 mm as the plus electrode, which the wire was stretched on the upper surface of the rotating drum in the perpendicular direction to the flow of the sheet, the electrostatic charging was performed by applying a direct current of about 9 kV to the positive electrode.

The thus obtained amorphous sheet-form material of polyethylene naphthalate was stretched 3.1 times in the longitudinal direction and 3.7 times in the transverse direction, and was subjected to heatset treatment for 10 min at 265° C. In the next place, the thus obtained film was subjected to relaxation of 10% in the transverse direction in the heatset treatment zone at 265° C. and the thus relaxed film was wound up while making the winding speed slower than the tenter speed by 0.5 m/min to obtain a polyethylene naphthalate film of 125 μm in thickness.

In the next place, the thus obtained biaxially stretched polyethylene naphthalate film was subjected to heat treatment for 5 sec at 160° C. under a tension of 60 g/mm$^2$ in a hot wind furnace while carrying the film on a rotating roll to obtain the polyethylene naphthalate film of the present invention (Sample A).

COMPARATIVE EXAMPLE 1

In the same manner as in Example 1 except for not carrying out the relaxation into longitudinal direction and transverse direction, a polyethylene naphthalate film of 125 μm in thickness was obtained (Sample B).

COMPARATIVE EXAMPLE 2

A commercialized polyester film for membrane switch was used as Sample C.

These three kinds of samples were subjected to heat treatment for 2 hours at 150° C., and thereafter, the haze-increasing rate, the heat shrinkage and the film flatness of the specimens and the aberration of the pattern in the membrane switch prepared from each of the specimens were examined, the results being shown in Table 1.

TABLE 1

|  |  | Example 1 | Comparative Example 1 | Comparative Example 2 |
|---|---|---|---|---|
| Haze-increasing rate |  | 1% | 1% | 90% |
| Heat shrinkage (%) | Longitudinal direction | 0.1 | 0.8 | 1.2 |
|  | Transverse direction | 0 | 0.5 | 0 |
| Film flatness |  | Good | Poor | Bad |
| Aberration of pattern in the membrane switch |  | Good | Bad | Bad |

What is claimed is:

1. A biaxially oriented polyethylene naphthalate film for membrane switch, which shows a haze-increasing rate of 1 to 20% and a heat shrinkage both in the longitudinal direction and in the transverse direction of not more than 0.5% when subjecting it to heat treatment for 2 hours at 150° C., prepared by longitudinal and transverse stretching followed by heatsetting and relaxation of the film.

2. A biaxially oriented polyethylene naphthalate film for membrane switch according to claim 1, wherein said haze-increasing rate is not more than 10%.

3. A biaxially oriented polyethylene naphthalate film for membrane switch according to claim 1, wherein said heat shrinkage both in the longitudinal direction and in the transverse direction is not more than 0.3%.

4. A membrane switch wherein a printed board comprises a biaxially oriented polyethylene naphthalate film which shows a haze-increasing rate of 1 to 20% and a heat shrinkage both in the longitudinal direction and in the transverse direction of not more than 0.5% when subjecting it to heat treatment for 2 hours at 150° C., and has been printed with an electroconductive material for circuit on one of the surfaces of the film, said film having been prepared by longitudinal and transverse stretching followed by heatsetting and relaxation of the film.

5. A membrane switch according to claim 4, which comprises
   the printed board, a surface sheet, said printed board and said surface sheet being superposed via an insulating spacer, and
   a metal disk contact point disposed on the electroconductive printed part.

6. A membrane switch according to claim 4, which comprises
   two printed boards, the printed surfaces of the printed boards facing to each other and two printed boards being superposed via an insulating spacer, and
   a surface sheet laminated on the non-printed surface of one of the printed boards.

7. A membrane switch according to claim 4, which comprises
   two printed boards, the printed surfaces of the printed board facing to each other and the printed boards being superposed via an insulating spacer, metal disk for click, and
   a surface sheet laminated on the superposed printed boards via an insulating spacer,
   said metal disk being disposed in the space comprising the superposed printed boards, the surface sheet and the insulating spacer, and corresponding to the printed contact point of electroconductive material.

* * * * *